United States Patent
Wong et al.

(10) Patent No.: US 6,900,082 B2
(45) Date of Patent: May 31, 2005

(54) METHODS FOR FORMING LATERALLY CRYSTALLIZED POLYSILICON AND DEVICES FABRICATED THEREFROM

(75) Inventors: Man Wong, Hong Kong (HK); Tianfu Ma, Clear Water Bay (HK); Zhiguo Meng, Clear Water Bay (HK)

(73) Assignee: Man Wong, The Hong Kong University of Science & Technology, Kowloon (HK)

( * ) Notice: Subject to any disclaimer, the term of this patent is extended or adjusted under 35 U.S.C. 154(b) by 0 days.

(21) Appl. No.: 10/373,378

(22) Filed: Feb. 24, 2003

(65) Prior Publication Data

US 2004/0166655 A1 Aug. 26, 2004

(51) Int. Cl.[7] ........................... H01L 21/00; H01L 21/84
(52) U.S. Cl. ...................................... 438/149; 438/488
(58) Field of Search ............................... 438/149, 150, 438/166, 488, 489, 764, 766, 795, 799

(56) References Cited

U.S. PATENT DOCUMENTS

| | | | | |
|---|---|---|---|---|
| 5,879,974 A | | 3/1999 | Yamazaki | 438/162 |
| 5,937,282 A | * | 8/1999 | Nakajima et al. | 438/149 |
| 5,940,693 A | * | 8/1999 | Maekawa | 438/166 |
| 6,077,731 A | | 6/2000 | Yamazaki et al. | 438/150 |
| 6,228,693 B1 | * | 5/2001 | Mackawa et al. | 438/166 |
| 6,558,986 B1 | * | 5/2003 | Choi | 438/149 |
| 6,692,996 B2 | * | 2/2004 | Lee et al. | 438/149 |

* cited by examiner

*Primary Examiner*—David Nhu
(74) *Attorney, Agent, or Firm*—Allen W. Groenke; Fredrikson & Byron, P.A.

(57) ABSTRACT

The present invention provides a method for forming metal-induced laterally crystallized polysilicon in which the metal residue is reduced. A first low temperature lateral crystallization is performed using a metal crystallization-inducing agent such as nickel or a nickel compound. A second lateral crystallization is then carried out which may be either a low-temperature crystallization using metal residue from the first crystallization as the metal crystallization-inducing agent, or may be a high temperature crystallization that does not require a metal.

16 Claims, 3 Drawing Sheets

METHODS FOR FORMING LATERALLY CRYSTALLIZED POLYSILICON AND DEVICES FABRICATED THEREFROM

FIELD OF THE INVENTION

This invention relates to novel methods for forming laterally crystallized polysilicon, and in particular to such methods capable of reducing the metal residue in metal-induced laterally crystallized (MILC) polysilicon. The invention father relates to devices fabricated from such polysilicon.

BACKGROUND OF THE INVENTION

Portable electronic devices such as laptop computers, personal digital assistants, and portable DVD players and the like have become increasingly common and popular. One reason for the success of such devices is the advance in the technology of low power, lightweight and inexpensive flat-panel displays. Future devices such as third generation mobile phones will require similar displays.

One of the major factors behind the advances in flat-panel display technology has been the replacement of slower electronic components fabricated from amorphous silicon with faster components made from polysilicon. The fabrication of polysilicon and devices constructed therefrom has become an important issue.

PRIOR ART

Conventional methods of forming polysilicon require the use of high-temperatures. Unfortunately the high temperatures required are inconsistent with the use of inexpensive glass panels as are popularly used in flat-panel displays. More recently, however, the formation of polysilicon using the technique of metal-induced lateral crystallization (MILC) of amorphous silicon has been developed. In MILC, a metal—usually nickel—is seeded in amorphous silicon to induce crystallization. An advantage of MILC techniques is that they allow the polysilicon to be formed at lower temperatures compatible with low-cost substrates such as glass.

An example of conventional metal-induced crystallization techniques can be found in U.S. Pat. No. 5,879,974 which uses a nickel solution to promote crystallization, though in this example the crystallization is not lateral crystallization. U.S. Pat. No. 6,077,731 describes both metal-induced and metal-induced lateral crystallization using in particular nickel as the metal element. Other possible metal elements include iron, cobalt, ruthenium, rhodium, palladium, osmium, iridium, platinum, copper and gold.

While the feasibility of MILC fabrication of polysilicon has been clearly established, one problem with conventional MILC techniques is that there remains a residue of the metal element trapped in the polysilicon. This residue may degrade the intrinsic performance of devices fabricated from the polysilicon, and may affect the long-term reliability of such devices. In both U.S. Pat. No. 5,879,974 and U.S. Pat. No. 6,077,731 the nickel is applied as a surface coating and is subsequently removed by a further surface treatment step (the use of $HF/H_2O_2/H_2O$ I the former, and the use of HCl in the latter). Neither document discloses any method for removing trapped nickel residue in the bulk polysilicon.

SUMMARY OF THE INVENTION

According to the present invention there is provided a method of forming laterally-crystallised polysilicon, comprising the steps of:

(a) providing a layer of amorphous silicon on a substrate,
(b) providing a metallic crystallization-inducing agent to a part of said layer of amorphous silicon,
(c) performing a metal-induced first lateral crystallization step at a temperature of between 400° C. and 650° C. to form first regions of metal-induced laterally crystallized polysilicon, and
(d) performing a second lateral crystallization step to extend said regions of laterally crystallized polysilicon.

In preferred embodiments of the invention the part of the layer of amorphous silicon to which the metallic crystallization-inducing agent is applied is removed prior to the second lateral crystallization step. In particular, in a preferred low-temperature embodiment of the invention that part of the amorphous layer is removed and the second lateral crystallization step is carried out at a temperature of between 400° C. and 650° C. In this embodiment of the invention the second crystallization is a form of MILC with residual metal in the first-formed polysilicon regions acting as the crystallization-inducing agent for the second crystallization. This has the effect of diluting the residual metal throughout the extended regions of polysilicon.

In a second, high-temperature, embodiment of the invention the part of the amorphous layer to which the metal crystallization-inducing agent is applied may be either removed or retained, but the second lateral crystallization step is carried out at a temperature of between 650° C. and 1200° C. In this embodiment the extended regions of polysilicon are formed because amorphous silicon is adjacent to the first-formed regions of polysilicon and at high-temperature such amorphous silicon will change to adopt the order of the polysilicon regions.

In either embodiment of the invention in step (b) the region is defined by forming a masking layer covering said layer of amorphous silicon except for said region. The metallic crystallization-inducing agent may be provided by evaporation onto the surface of the masking layer and the region, or alternatively by ion implantation in the region.

After forming the extended laterally-crystallized polysilicon regions a high-temperature anneal may be performed.

Preferably the metallic crystallization-inducing agent comprises nickel, cobalt, palladium, platinum, titanium or combinations thereof or a compound containing one or more of these metals.

Viewed from another broad aspect the present invention also provides a method of forming laterally-crystallized polysilicon from amorphous silicon comprising a metal-induced first lateral crystallization step followed by a second lateral crystallization step.

Viewed from a still further broad aspect the present invention also provides a semiconductor device comprising polysilicon wherein said polysilicon is formed from amorphous silicon by performing a metal-induced first lateral crystallization step followed by a second lateral crystallization step.

BRIEF DESCRIPTION OF THE DRAWINGS

Some embodiments of the invention will now be described by way of example and with reference to the accompanying drawings, in which.

DETAILED DESCRIPTION OF PREFERRED EMBODIMENTS

Figure 1:
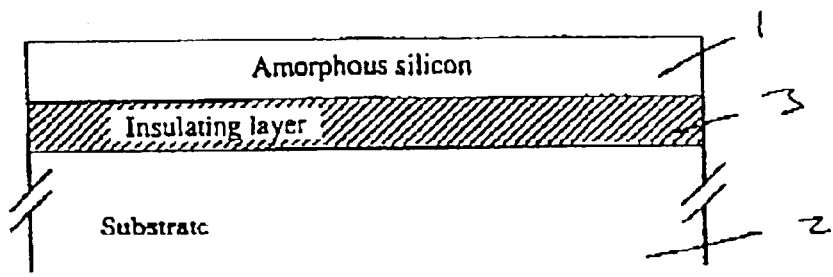
FIG. 1 shows the formation of an amorphous silicon layer on a substrate being a first step in a method according to an embodiment of the invention.

In an embodiment of the invention a layer of amorphous silicon 1 is firstly formed on a substrate 2 separated by an insulating layer 3 as shown in FIG. 1. The layer of amorphous silicon, preferably in the range of 15 nm to 3 $\mu$m thick, is formed at a temperature of between 150° C. and 600° C. using one of a variety of known techniques such as sputtering, evaporation or chemical vapor deposition (CVD). The amorphous silicon can be doped during deposition of after deposition (for example by ion implantation). In the preferred embodiment boron maybe used as a p-type dopant and either phosphorus or arsenic is used as an n-type dopant.

The substrate can be a polymer, glass, 10 nm to 3 $\mu$m thick insulator-covered stainless steel or polysilicon, or single-crystal silicon. The substrate may include pre-fabricated conventional integrated circuits.

The layer of amorphous silicon may be optionally patterned into desired shapes using conventional microfabrication techniques.

Figure 2:
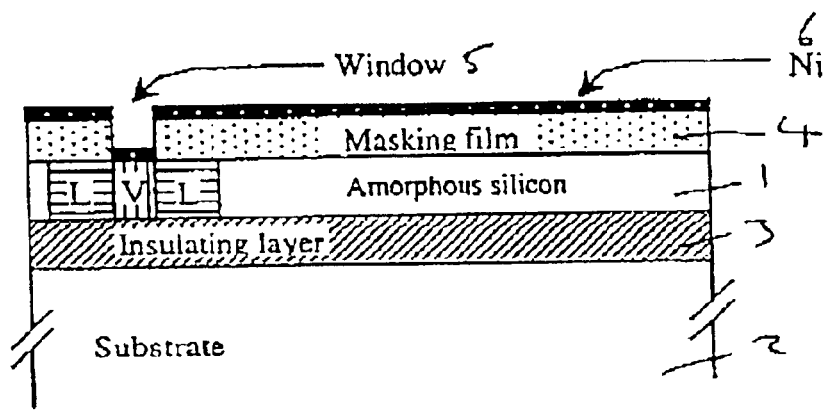
FIG. 2 shows the first crystallization step according to an embodiment of the invention.

Referring now to FIG. 2, a masking layer 4, 0.1 $\mu$m to a few $\mu$m thick, is deposited on the surface of the amorphous silicon and is patterned to define a window 5 where the amorphous silicon is exposed. A metal crystallization-inducing agent 6 is then added to the window either by evaporation over the surface of the masking layer 4 and window 5 as shown in FIG. 2, or by implantation in the area of the window 5 only. The metal crystallization-inducing agent 6 may be either a pure metal or a metal compound with the metal itself being selected from nickel, cobalt, palladium, platinum, titanium or combinations thereof. In the embodiment of FIG. 2 a layer of nickel 0.5 nm to 50 nm thick is deposited by evaporation over the surface of the masking layer 4 and the window 5. The masking layer 4 can be either removed or retained before the first crystallization step to be described below.

Following the addition of the metal crystallization-inducing agent 6 a first lateral crystallization step is carried out as shown in FIG. 2. This first crystallization is performed at a temperature of between 350° C. and 650° C. and results in a region of vertically-crystallized polysilicon (V) in the region of the window 5, and two regions of laterally-induced polysilicon (L) extending to either side of the region V immediately below the window 5. The laterally-induced regions (L) are largely {111}-oriented along the direction of lateral crystallization and may be of a length between 1 $\mu$m and 100 s of $\mu$m depending on the duration of this first crystallization.

Figure 3:
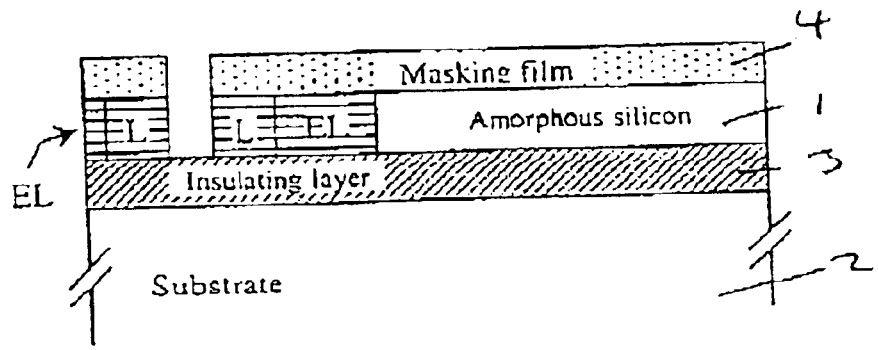
FIG. 3 shows the second crystallization step according to a first embodiment of the invention.
Figure 4:
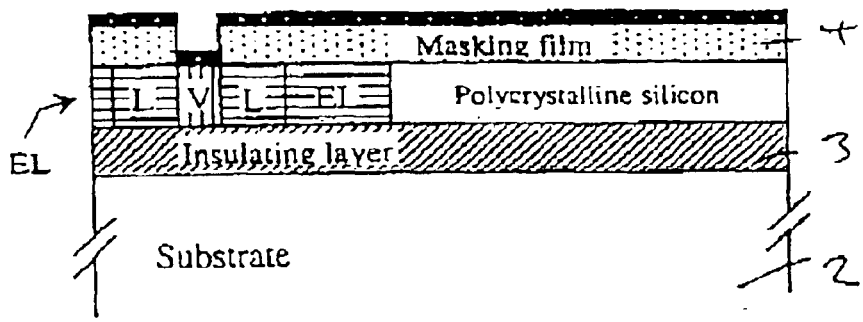
FIG. 4 shows the second crystallization step according to a second embodiment of the invention.

Following this first crystallization a second crystallization is then carried out which may be either at a low temperature (FIG. 3) or a high-temperature (FIG. 4). Both these variations will now be described.

In the low-temperature embodiment the masking layer 4 (if not previously removed before the first crystallization) may still be either retained or removed. The vertically-crystallized region V is then removed and a second lateral crystallization is carried out at a temperature of between 400° C. and 650° C. for a time sufficiently long to produce a polysilicon extension region (EL) ranging in length from 1 $\mu$m to 100 s of $\mu$m depending on the duration of this second crystallization. An optional high-temperature anneal at 700° C. to 1200° C. for a few hours can be carried out to recrystallize the silicon if desired.

In this "low-temperature" embodiment of the invention the second crystallization is also an example of MILC with the residual Ni from the first crystallization acting as the crystallization-inducing agent. Since the original source of metal has been removed, however, the nickel in the first formed polysilicon regions L and the extension regions EL is diluted and the Ni residue concentration is reduced.

In the high-temperature embodiment of the invention the vertically-crystallized region V may be either removed or retained. In FIG. 4 the high-temperature embodiment is shown with both the masking layer 4 and the region V retained. In this embodiment the second crystallization is carried out at a temperature of between 650° and 1200° C. for between tens of minutes and a few hours to form extension regions EL of polysilicon that is largely {111}-oriented.

In this embodiment the second crystallization is a spontaneous process that occurs at elevated temperatures when amorphous silicon is placed next to polysilicon. The atoms in the amorphous silicon re-arrange to follow the order imposed by the polysilicon. In a sense therefore the first laterally-induced regions L serve as a template for the extension regions EL. The metal such as nickel is not required for this process and therefore minimum Ni should exist in the extension regions. Furthermore even if the region V bearing Ni is retained, at elevated temperatures the reaction of Ni with Si is a faster process than the diffusion of Ni within silicon and thus even if the Ni-containing window is retained nickel silicides will be formed before the Ni has a chance to diffuse through the silicon.

Figure 5:
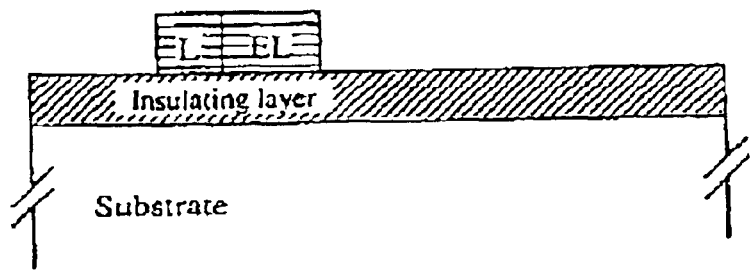
FIG. 5 shows the final polysilicon formed by an embodiment of the invention.

Following the second crystallization, the masking layer 4 is removed if it has been retained to that point, and the exposed silicon layer may be pattered as desired leaving, for example, only the laterally-induced polysilicon as shown in FIG. 5. The polysilicon is then ready for fabrication into a variety of devices, a selection of which will be described in the following examples.

Figure 6:
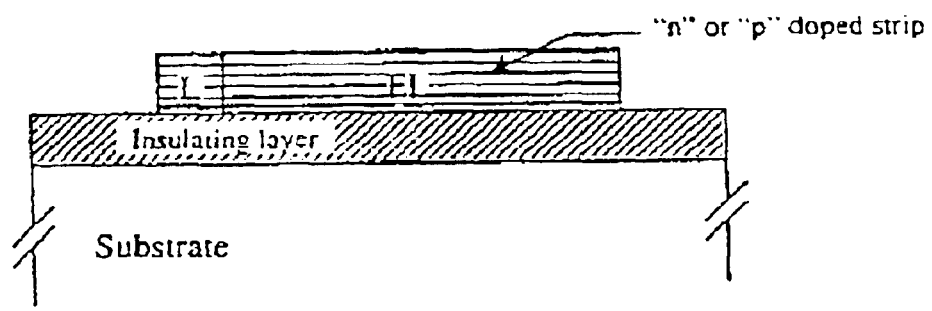
FIG. 6 illustrates the formation of a doped polysilicon strip using an embodiment of the invention.

FIG. 6 shows a doped strip which may be either n-doped or p-doped by using either ion implantation or thermal diffusion. Such a doped strip can be used in a number of potential applications, such as an electrical resistor, a temperature-sensing thermistor, a strain/stress sensing piezo-resistor, an infra-red detector or a photodetector. Additional dopants can also be introduced into the strip and the precise characteristics of the strip can be controlled by the doping level.

Figure 7:
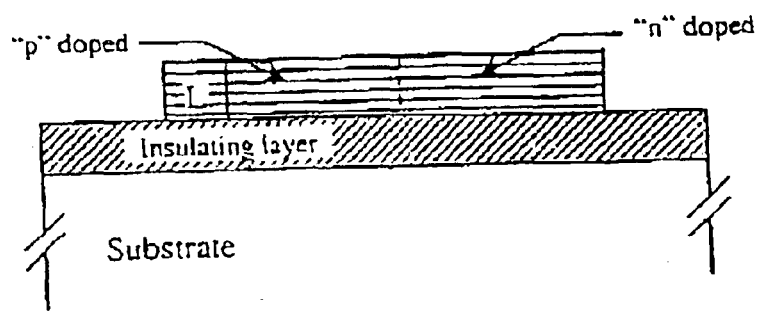
FIG. 7 illustrates the formation of a p-n junction using an embodiment of the invention.

FIG. 7 shows a p-n junction formed by oppositely doping adjacent parts of the extended MILC polysilicon. Such a p-n junction has potential applications as a rectifying device, an infra-red detector or a photodetector.

Figure 8:
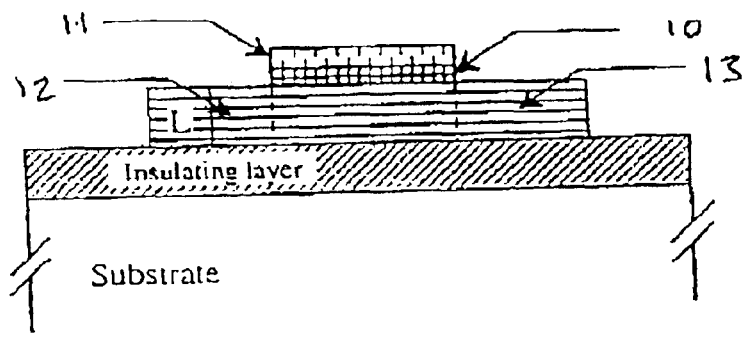
FIG. 8 illustrates the formation of a thin-film transistor using an embodiment of the invention.

FIG. 8 shows a thin-film transistor. Such a thin-film transistor may be formed by firstly suitably doping the entire MILC polysilicon to adjust the threshold voltage of the transistor. A thin layer of gate insulator 10, such as silicon dioxide or silicon oxynitride, is next deposited on the surface of the polysilicon. If the substrate is compatible, this with processing at a temperature of greater than 750° C. the insulator can be thermally grown or deposited oxide thermally annealed in a slightly oxidizing ambient at a temperature of between 750° C. and 1200° C. A gate electrode 11 of either conducting or semi-conducting material is formed on the gate insulator 10. The gate electrode 11 could, for example, be amorphous silicon deposited at a temperature of from 150° C. to 600° C. Again, if the substrate was compatible with higher temperatures, eg a process temperature of 600° C. or above, the gate electrode could be deposited polysilicon.

The stack of gate insulator 10 and gate electrode 11 is then micro-lithographically defined and etched, and then self-aligned heavy doping ($>10^{15}/cm^2$) of the source 12, gate 11 and drain 13 electrodes are carried out by a technique such as ion implantation or thermal diffusion. Heating, by for example furnace heating, rapid-thermal heating or laser-induced heating, is used to thermally anneal for activation and/or diffusion of the dopants. An insulating layer, such as deposited silicon dioxide, is formed and contact holes opened to the desired electrodes. Metal lines are formed for device inter-connection and sintering is performed to reduce contact resistance and to passivate residual dangling bonds.

Figure 9:
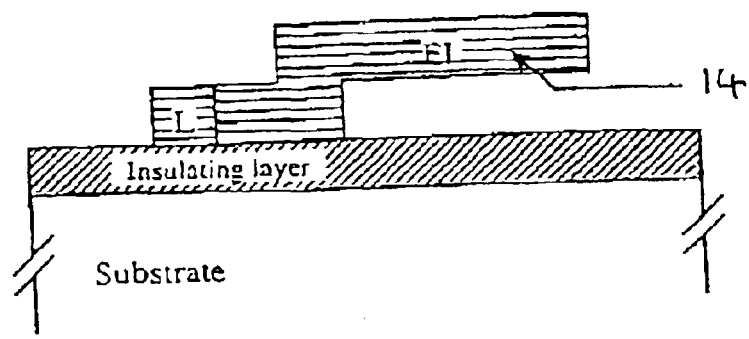
FIG. 9 illustrates the formation of a micro-mechanical structure using an embodiment of the invention.

FIG. 9 shows a possible micro-mechanical structure. In this embodiment the MILC polysilicon extension is formed as a suspended cantilevered beam 14. To achieve this structure the fabrication method of FIGS. 1 to 5 is modified by firstly depositing on the insulating layer on the substrate a patterned sacrificial layer that will underlie the MILC polysilicon extension EL and can then subsequently be removed leaving the structure of FIG. 9.

What is claimed is:

1. A method of forming laterally-crystallized polysilicon, comprising the steps of: (a) providing a layer of amorphous silicon on a substrate, (b) providing a metallic crystallization-inducing agent to a part of said layer of amorphous silicon; (c) performing a metal-induced first lateral crystallization step at a temperature of between 400 degrees C. and 650 degrees C. to form first regions of metal-induced laterally crystallized polysilicon; and (d) performing a second lateral crystallization step to extend said regions of laterally crystallized polysilicon.

2. A method as claimed in claim 1 wherein the part of said layer of amorphous silicon to which said metallic crystallization-inducing agent is applied is removed prior to said second lateral crystallization step.

3. A method as claimed in claim 2 wherein the second lateral crystallization step is carried out at a temperature of between 400 degrees C. and 650 degrees C.

4. A method as claimed in claim 2 wherein the second lateral crystallization step is carried out at a temperature of between 650 degrees C. and 1200 degrees C.

5. A method as claimed in claim 1 wherein in step (b) said the part of said amorphous layer is defined by forming a masking layer covering said layer of amorphous silicon except for said part.

6. A method as claimed in claim 5 wherein said metallic crystallization-inducing agent is provided by evaporation onto the surface of said masking layer and said part of the amorphous layer to which said agent is to be applied.

7. A method as claimed in claim 5 wherein said metallic crystallization-inducing agent is applied by ion implantation in said part of the amorphous layer.

8. A method as claimed in claim 1 wherein after step (d) a high-temperature anneal is performed.

9. A method as claimed in claim 1 wherein in step (b) said metallic crystallization-inducing agent comprises nickel, cobalt, palladium, platinum, titanium or combinations thereof or a compound containing one or more of these metals.

10. A method of forming laterally-crystallized polysilicon from amorphous silicon comprising a metal-induced first lateral crystallization step followed by a second lateral crystallization step.

11. A method as claimed in claim 10 wherein said metal-induced first lateral crystallization step is carried out at a temperature of between 400 degrees C. and 650 degrees C.

12. A method as claimed in claim 11 wherein said second lateral crystallization step is a metal-induced crystallization and is carried out at a temperature of between 400 degrees C. and 650 degrees C.

13. A method as claimed in claim 11 wherein said second lateral crystallization step is carried out at a temperature of between 650 degrees C. and 1200 degrees C.

14. A method as claimed in claim 10 wherein said metal-induced first lateral crystallization step includes applying the metal to a first portion of the amorphous silicon, further comprising removing at least a part of the first portion of amorphous silicon after the metal-induced first lateral crystallization step, but before the second lateral crystallization step.

15. A method as claimed in claim 14 wherein said second lateral crystallization step is carried out at a temperature of between 650 degrees C. and 1200 degrees C.

16. A method as claimed in claim 1 wherein the second lateral crystallization step is carried out at a temperature of between 650 degrees C. and 1200 degrees C.

* * * * *

UNITED STATES PATENT AND TRADEMARK OFFICE
CERTIFICATE OF CORRECTION

PATENT NO. : 6,900,082 B2 Page 1 of 1
APPLICATION NO. : 10/373378
DATED : May 31, 2005
INVENTOR(S) : Man Wong et al.

It is certified that error appears in the above-identified patent and that said Letters Patent is hereby corrected as shown below:

On title page, item 73 Assignee
replace "Man Wong, The Hong Kong University of Science & Technology"
with --Man Wong--.

Signed and Sealed this

Nineteenth Day of December, 2006

JON W. DUDAS
*Director of the United States Patent and Trademark Office*